United States Patent
Lee et al.

(10) Patent No.: US 7,861,147 B2
(45) Date of Patent: Dec. 28, 2010

(54) ACS UNIT AND METHOD THEREOF

(75) Inventors: Ying-Cheng Lee, Taipei (TW); Jeff Lin, Taipei (TW)

(73) Assignee: Via Technologies, Inc., Hsin-Tien, Taipei (TW)

( * ) Notice: Subject to any disclaimer, the term of this patent is extended or adjusted under 35 U.S.C. 154(b) by 1054 days.

(21) Appl. No.: 11/608,459

(22) Filed: Dec. 8, 2006

(65) Prior Publication Data

US 2008/0140743 A1    Jun. 12, 2008

(51) Int. Cl.
*H03M 13/03*    (2006.01)
(52) U.S. Cl. .................. 714/796; 714/794; 714/804
(58) Field of Classification Search .................. 714/796, 714/792, 795, 794, 804, 820
See application file for complete search history.

(56) References Cited

U.S. PATENT DOCUMENTS

| | | | | |
|---|---|---|---|---|
| 6,327,316 | B1 * | 12/2001 | Ikeda | ................. 375/341 |
| 7,073,118 | B2 * | 7/2006 | Greenberg et al. | .......... 714/796 |
| 7,117,426 | B2 * | 10/2006 | Wu et al. | .................. 714/795 |
| 7,496,159 | B2 * | 2/2009 | Wu et al. | .................. 375/341 |
| 7,506,239 | B2 * | 3/2009 | Sudhakar et al. | ............ 714/795 |
| 2005/0120287 | A1 * | 6/2005 | Wu et al. | .................. 714/795 |
| 2006/0029145 | A1 * | 2/2006 | Rajagopal et al. | ........... 375/265 |
| 2006/0143554 | A1 * | 6/2006 | Sudhakar et al. | ............ 714/795 |

* cited by examiner

*Primary Examiner*—Fritz Alphonse
(74) *Attorney, Agent, or Firm*—Thomas, Kayden, Horstemyer & Risley (57) ABSTRACT

An add-compare-select (ACS) unit generates first path metrics having a first bit-pair and a most significant bit-pair (MSB) each including a high bit and a low bit. A first ACS circuit produces the first bit-pair and a first carry. A limiting circuit generates the MSB based on the first carry, and limits the MSB to a first predetermined value. A MSB maximum select (MS) unit receives an MSB of second path metrics from another ACS unit, and compares the MSBs of the first and the second path metrics to determine MSB decision signals based on maximum likelihood selection. A MSB storage unit stores the MSB of the first path metrics. A reset unit resets the high bit of the MSB of the first path metrics to a second predetermined value when the high bits of the MSBs of the first and the second path metrics reach the first predetermined value.

20 Claims, 9 Drawing Sheets

| $C_{in}$ | $S_{in}$ | $C_{out}$ | $S_{out}$ | Decimal number |
|---|---|---|---|---|
| 0 | 0 | 0 | 0 | 0 |
| 0 | 1 | 0 | 1 | 1 |
| 1 | 0 | 0 | 1 | 1 |
| 1 | 1 | 1 | 1 | 2 |

ACS UNIT AND METHOD THEREOF

BACKGROUND OF THE INVENTION

1. Field of the Invention

The invention relates to a decoder in a communication system, and in particular to an add-compare-select (ACS) unit in a decoder and a method thereof.

2. Description of the Related Art

Convolutional encoding is typically utilized in digital communication systems to combat noise and interference during data transmission. Convolutional encoded data is recovered by a convolutional decoder in a receiver. A Viterbi decoder is a convolutional decoder used to achieve the maximum likelihood of decoding convolutional codes, by selecting a code sequence from a plurality of possible code sequences to decode the received data. An add-compare-select (ACS) unit is the key functional unit of a Viterbi decoder. The ACS unit compares the probability of all possible code sequences to decide a most likely sequence. The convolutional decoder may be implemented with pipelining, look-ahead, and parallelism techniques to enhance computation speed and circuit performance. These techniques, however, increase circuit complexity, circuit dimensions and manufacturing cost.

Thus an ACS unit and a method capable of minimizing circuit dimensions, without degrading circuit performance incurred by the use of pipelining, look-ahead, and parallelism techniques are desirable.

BRIEF SUMMARY OF THE INVENTION

A detailed description is given in the following embodiments with reference to the accompanying drawings.

An embodiment of an add-compare-select (ACS) unit in a maximum likelihood decoder, performing an ACS operation to generate first path metrics having a first bit-pair and a most significant bit-pair (MSB), wherein each bit-pair is a redundant number representation having a high bit and a low bit, and comprising a first ACS circuit and an MSB ACS circuit is disclosed. The first ACS circuit produces the first bit-pair of the first path metrics and a first carry. The MSB ACS circuit comprises a limiting circuit, an MSB maximum select unit, an MSB storage unit, and a reset unit. The limiting circuit, coupled to the first ACS circuit, generates the MSB of the first path metrics based on the first carry, and limits the MSB of the first path metrics to a first predetermined value. The MSB maximum select (MS) unit, coupled to the limiting circuit and another ACS unit, receives an MSB of second path metrics from the other ACS unit, and compares the MSBs of the first and the second path metrics to determine MSB decision signals based on maximum likelihood selection. The MSB storage unit, coupled to the MSB maximum select unit, stores the MSB of the first path metrics as an MSB of a previous first path metric. The reset unit, coupled to the MSB maximum select unit and the MSB storage unit, and resets the MSB of the first path metrics to a second predetermined value when the high bits of the MSBs of the first and the second path metrics reach the first predetermined value.

According to another embodiment of the invention, a Viterbi decoder comprises a branch metrics unit, an add-compare-select (ACS) unit, and a survivor metrics unit. The branch metrics unit calculates branch metrics from input data. The add-compare-select (ACS) unit, coupled to the branch metrics unit, receives the branch metrics and second path metrics from a second ACS unit to generate first path metrics having a first bit-pair and a most significant bit-pair (MSB), and survivor metrics, where each bit-pair is in redundant representation having a high bit and a low bit, and comprises a limiting circuit, an MSB maximum selection (MS) unit, an MSB storage unit, and a reset unit. The first ACS circuit produces the first bit-pair of the first path metrics, a first carry, and the survivor metrics. The limiting circuit, coupled to the first ACS circuit, generates the MSB of the first path metrics based on the first carry, and limits the MSB of the first path metrics to a first predetermined value. The MSB maximum selection (MS) unit, coupled to the limiting circuit, receives an MSB of second path metrics from the other ACS unit, and compares the MSBs of the first and the second path metrics to determine MSB decision signals based on maximum likelihood selection. The MSB storage unit, coupled to the MSB maximum select unit, stores the MSB of the first path metrics as an MSB of a previous first path metric. The reset unit, coupled to the MSB maximum select unit and the MSB storage unit, resets the MSB of the first path metrics to a second predetermined value when the high bits of the MSBs of the first and the second path metrics reach the first predetermined value. The survivor metrics unit, coupled to the ACS unit, traces back the survivor path to decode the input data.

According to another embodiment of the invention, an add-compare-select (ACS) method for use in an ACS unit in a maximum likelihood decoder, generating first path metrics having a first bit-pair and a most significant bit-pair (MSB), where each bit-pair is in redundant number representation having a high bit and a low bit is disclosed. The ACS method comprises producing the first bit-pair of the first path metrics and a first carry, generating the MSB of the first path metrics based on the first carry, limiting the MSB of the first path metrics to a first predetermined value, comparing the MSBs of the first path metrics and second path metrics from another ACS unit to determine MSB decision signals based on maximum likelihood selection, storing the MSB of the first path metrics as an MSB of a previous first path metric, and resetting the MSB of the first path metrics to a second predetermined value when the high bits of the MSBs of the first and the second path metrics reach the first predetermined value.

BRIEF DESCRIPTION OF THE DRAWINGS

The invention can be more fully understood by reading the subsequent detailed description and examples with references made to the accompanying drawings, wherein:

FIG. 5b is a truth table of code converter 1822, incorporating the code converter in FIG. 5a.

FIG. 6 is an abstract illustration of an exemplary ACS operation in the invention, incorporating the ACS unit 182 in FIG. 4a.

FIG. 7 is a block diagram of an exemplary most significant bit-pair (MSB) of ACS unit 182 in FIG. 4a.

DETAILED DESCRIPTION OF THE INVENTION

The following description is of the best-contemplated mode of carrying out the invention. This description is made for the purpose of illustrating the general principles of the invention and should not be taken in a limit sense. The scope of the invention is best determined by reference to the appended claims.

The scope of the invention may include, but is not limited to cellular, video/audio broadcasting, Local Area Networks (LANs), Wireless LANs (WLANs), satellite communications, and the like.

Figure 1:
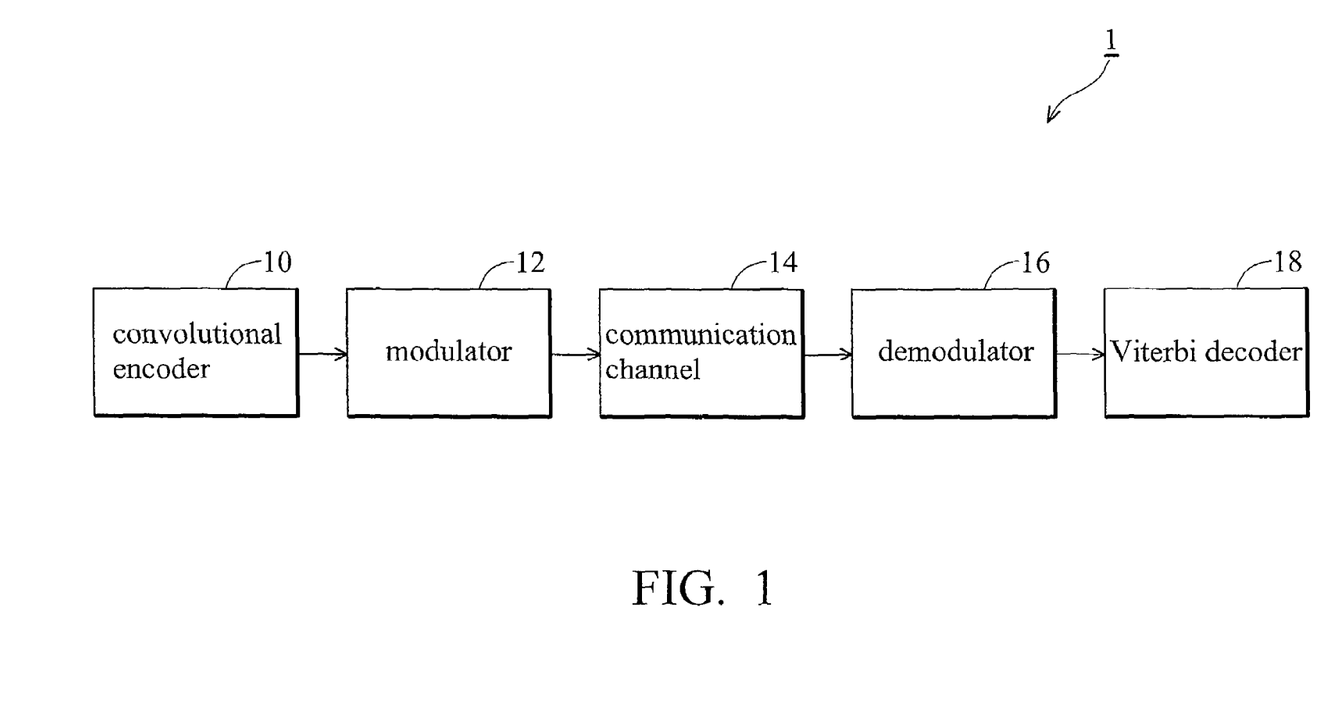
FIG. 1 is a block diagram of a communication system employing convolutional encoding with Viterbi decoding.

FIG. 1 is a block diagram of a communication system employing convolutional encoding with Viterbi decoding, comprising convolutional encoder 10, modulator 12, communication channel 14, demodulator 16, and Viterbi decoder 18. Convolutional encoder 10 is coupled to modulator 12, communication channel 14, demodulator 16, then to Viterbi decoder 18.

Convolutional encoder 10 is located at a transmitter end, encoding an m-bit symbol into n-bit convolutional data Dc, where n is larger than m and m/n is a code rate. Convolutional data Dc are error correction code with redundant bits generated by modulo-2 convolutions. Modulator 12 then modulates convolutional data Dc with a carrier frequency to generate modulated signal Sm, suitable for transmission over communication channel 14, and demodulator 16 demodulated the modulated signal back to convolutional data Dc.

After data transmission over a noisy communication channel 14, convolutional data Dc are received in Viterbi decoder 18 at a receiver end. Viterbi decoder 18 is a maximum likelihood decoder determining a most likely data sequence by estimating probabilities of transitions in convolutional data Dc.

In one embodiment, convolutional data Dc may be hard, i.e., binary number b'0 or b'1. In another embodiment, convolutional data Dc may be soft, i.e., multiple bits are employed for each data bit, representing data between 0 and 1. For example, convolutional data Dc conforming to gigabit Ethernet and 802.11n utilize 2-bit soft decision value, b'00 indicates the data bit is mostly close to data 0, b'01 indicating 33% between data 0 and data 1, b'10 is 66% between data 0 and data 1, and b'11 is mostly close to data 1.

Figure 2:
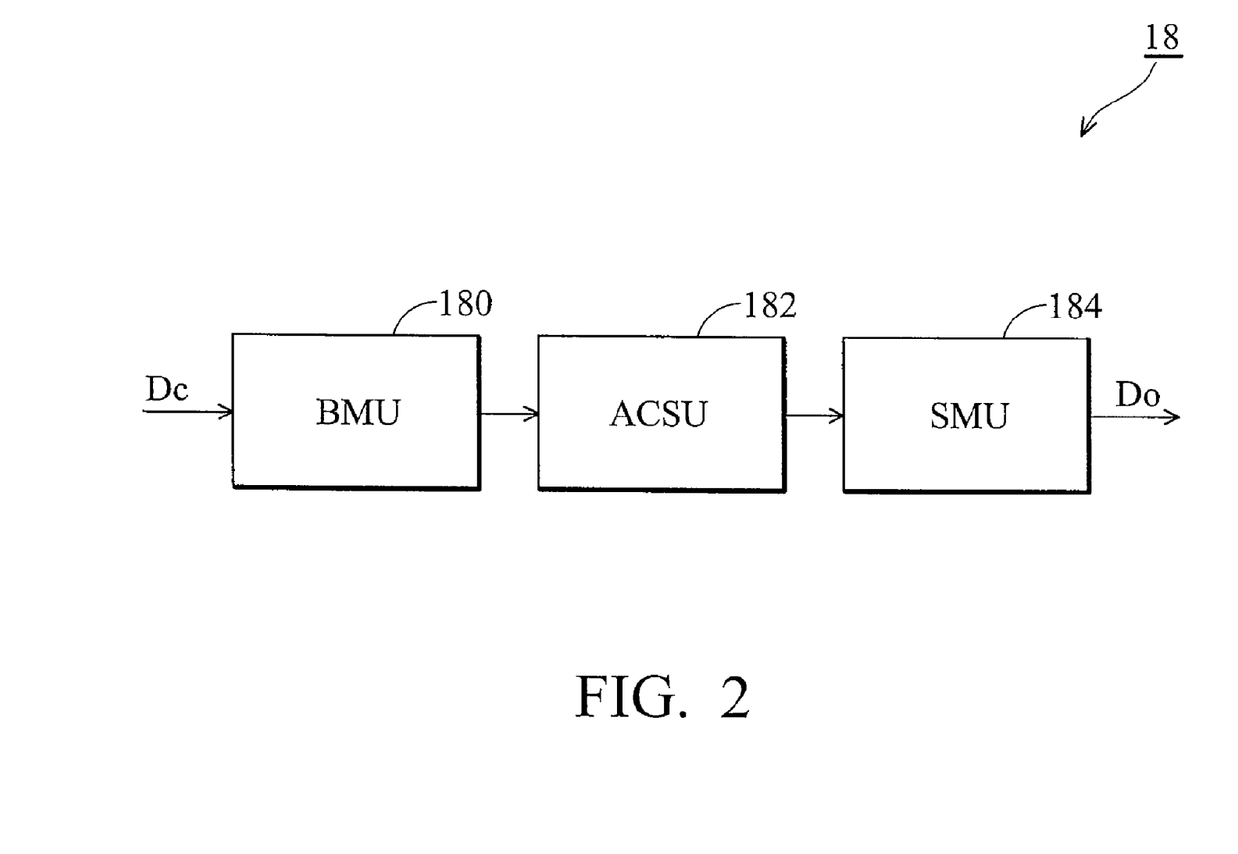
FIG. 2 is a block diagram of Viterbi decoder 18 according to the invention.

FIG. 2 is a block diagram of Viterbi decoder 18 according to the invention, comprising branch metrics unit (BMU) 180, add-compare-select (ACS) unit 182, and survivor metrics unit (SMU) 184. Branch metrics unit 180 is coupled to ACS unit 182, then to survivor metrics unit 184.

Viterbi decoder 18 obtains convolutional data Dc in an input data block of n-bit to generate an output data block of m-bit, depending on the data rate thereof. For example, n is 2 for a ½ rate encoder, and n is 3 a ⅓ or ⅔ rate encoder. In some embodiments, convolutional data Dc is 2-bit soft encoded, thus Viterbi decoder 18 decodes on a basis of 2n-bit.

Viterbi decoder 18 utilizes maximum likelihood decoding to determine a particular code sequence with maximum likelihood in all possible code sequences. A transition of convolutional data Dc from one state to the next is referred to as a branch.

Branch metric unit 180 calculates distances between convolutional data Dc and code sequences predicted in corresponding branches to generate branch metrics BM. ACS unit 182 adds branch metrics BM to a corresponding prior path metric $\gamma_j(t-1)$ to determine a current path metric $\gamma_j(t)$ for each possible state and generates survivor metrics SM based thereon, which may be stored in a trace-back memory in survivor metrics unit 184. This process may be iterated until a decoding length is reached, which may be five to ten times the constraint length. Survivor metrics unit 184 traces back a survivor path through survivor metrics SM in the trace-back memory, thereby decoding a code sequence.

Figure 3A:
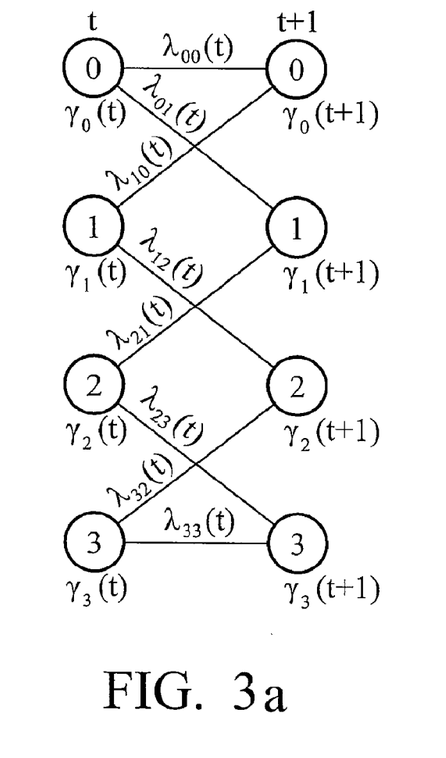
FIG. 3a is a portion of a trellis diagram with four-state convolutional data Dc and radix-2 algorithm.

FIG. 3a is a portion of a trellis diagram with four-state convolutional data Dc and radix-2 algorithm, incorporating Viterbi decoder 2 in FIG. 2, comprising states 0, 1, 2, 3, stage t and (t+1), branch metrics $\lambda_{00}(t)$, $\lambda_{10}(t)$, $\lambda_{01}(t)$, $\lambda_{21}(t)$, $\lambda_{12}(t)$, $\lambda_{32}(t)$, $\lambda_{23}(t)$, $\lambda_{33}(t)$, and path metrics $\gamma_0(t)$, $\gamma_1(t)$, $\gamma_2(t)$, $\gamma_3(t)$, $\gamma_0(t+1)$, $\gamma_1(t+1)$, $\gamma_2(t+1)$, and $\gamma_3(t+1)$.

Trellis diagram 3a depicts a process of an add-compare-select operation performed at each time stage. Time stages are separated by the time between receiving groups of input data (n-bit). Each convolutional data Dc may be in one of the four states at each stage, a trellis diagram calculates the probability of a convolutional data Dc in each respective state at each stage and selects a state with maximum likelihood to produce the survivor path. A path metric is computed by combining a previous path metric with a branch metric every stage, for example, path metric $\gamma_0(t)$ is combined with branch metrics $\lambda_{00}(t)$ to produce next path metric $\gamma_0(t+1)$ at time (t+1). At every stage two path metrics from two corresponding branches are compared to select the one with the maximum likelihood by a maximum select circuit or a minimum select circuit, depending on the used algorithm. In one embodiment the maximum select algorithm is implemented, ACS unit 182 computes path metrics $(\gamma_0(t)+\lambda_{00}(t))$ and $(\gamma_0(t)+\lambda_{10}(t))$, a maximum select circuit in ACS unit 182 then compares $(\gamma_0(t)+\lambda_{00}(t))$ and $(\gamma_0(t)+\lambda_{10}(t))$ to select a maximum for generating a survivor metric. While only two stages and four states are shown in FIG. 3a, ACS operations may be performed for multiple stages and states to determine the survivor path with maximum likelihood. In general, the number of the states $2^M$ is determined by an M-bit data symbol in convolutional data Dc.

Figure 3B:
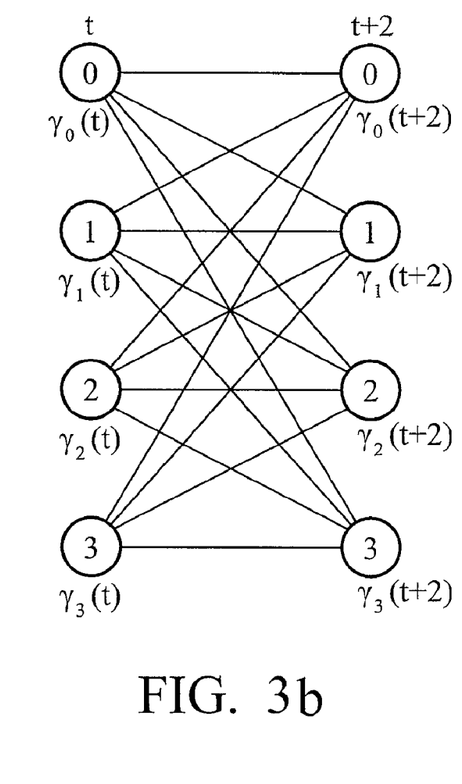
FIG. 3b is a portion of a trellis diagram with four-state convolutional data Dc and radix-4 algorithm.

FIG. 3b is a portion of a trellis diagram with four-state convolutional data Dc and radix-4 algorithm, incorporating Viterbi decoder 2 in FIG. 2, comprising states 0, 1, 2, 3, time indexes t and (t+1).

At stage t, path metrics $\gamma_0(t)$, $\gamma_1(t)$, $\gamma_2(t)$, and $\gamma_3(t)$ are calculated, and path metrics $\gamma_0(t)$, $\gamma_1(t)$, $\gamma_2(t)$, and $\gamma_3(t)$ are further computed at stage (t+1) based on $\gamma_0(t)$, $\gamma_1(t)$, $\gamma_2(t)$, and $\gamma_3(t)$ and branch metrics $\lambda_{00}(t)$ through $\lambda_{33}(t)$. Radix-4 algorithm deploys 2-step look ahead technique, in which one iteration in ACS unit 182 is equivalent to 2 iterations in the non-look-ahead implementation in FIG. 3a, doubling the ACS operating efficiency for a given decoding data rate. For each current state $\gamma_j(t+1)$ and j, 0 through 3, ACS unit 182 computes state transition from 4 branches for a path metric at each current state $\gamma_j(t+1)$, compares and selects the one with maximum likelihood thereform to produce a survivor metric to be stored in the trace back memory in survivor metric unit 184.

Figure 4A:
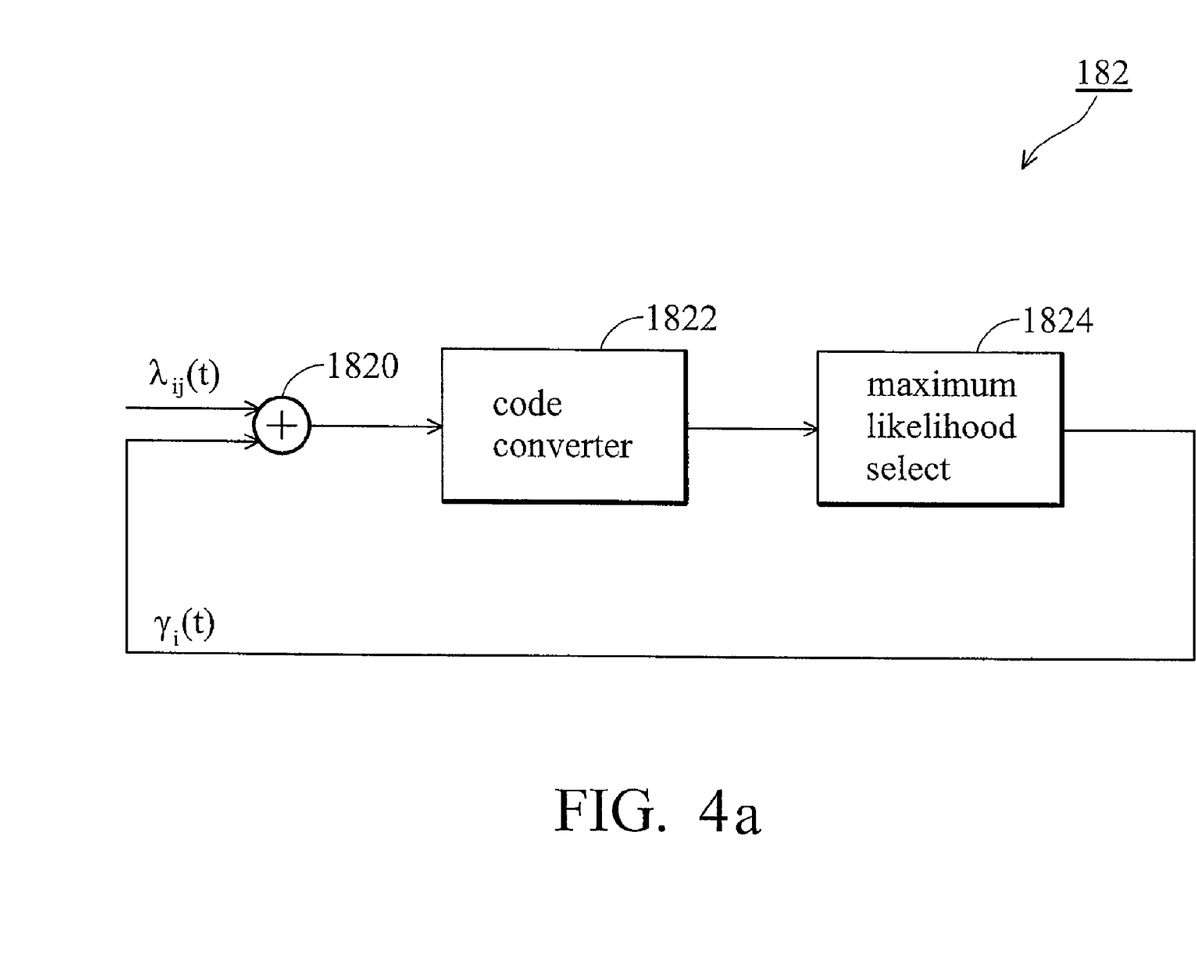
FIG. 4a is a block diagram of an exemplary ACS unit incorporated in the Viterbi decoder in FIG. 2.

FIG. 4a is a block diagram of an exemplary ACS unit incorporated in the Viterbi decoder in FIG. 2, comprising adder 1820, code converter 1822, and maximum likelihood select unit 1824. Adder 1820 is coupled to code converter 1822, and subsequently to maximum likelihood select unit 1824.

Adder 1820 adds a branch metric to a previous path metric to produce a current path metric, code converter 1822 recodes the current path metric to simplify maximum likelihood selection circuits, maximum likelihood select unit 1824 receives the recoded current path metric and other recoded current path metric corresponding to another branch to select the one with the maximum likelihood therefrom.

Adder 1820 is a carry-save adder producing a current path metric in redundant number representation where an identical number may be represented by more than one form. For example, a current path metric may comprise 3 bit-pairs [xxx] representing a decimal number from 0 to 14, with x being a bit-pair representing 0, 1, or 2. In redundant number representation the 3 bit-pair [002] is equivalent to [010], and the 3 bit-pair [020] is equivalent to [100]. A carry-save adder always propagates each bit-pair "2" to a carry bit to the next higher bit-pair in the next clock cycle, such as [002] to [010] and [020] to [100]. The path metrics overflow when [2xx] in the most significant bit-pair propagates to the MSB output carry, even if the 3 bit-pair path metric has not reached [222].

Figure 4B:
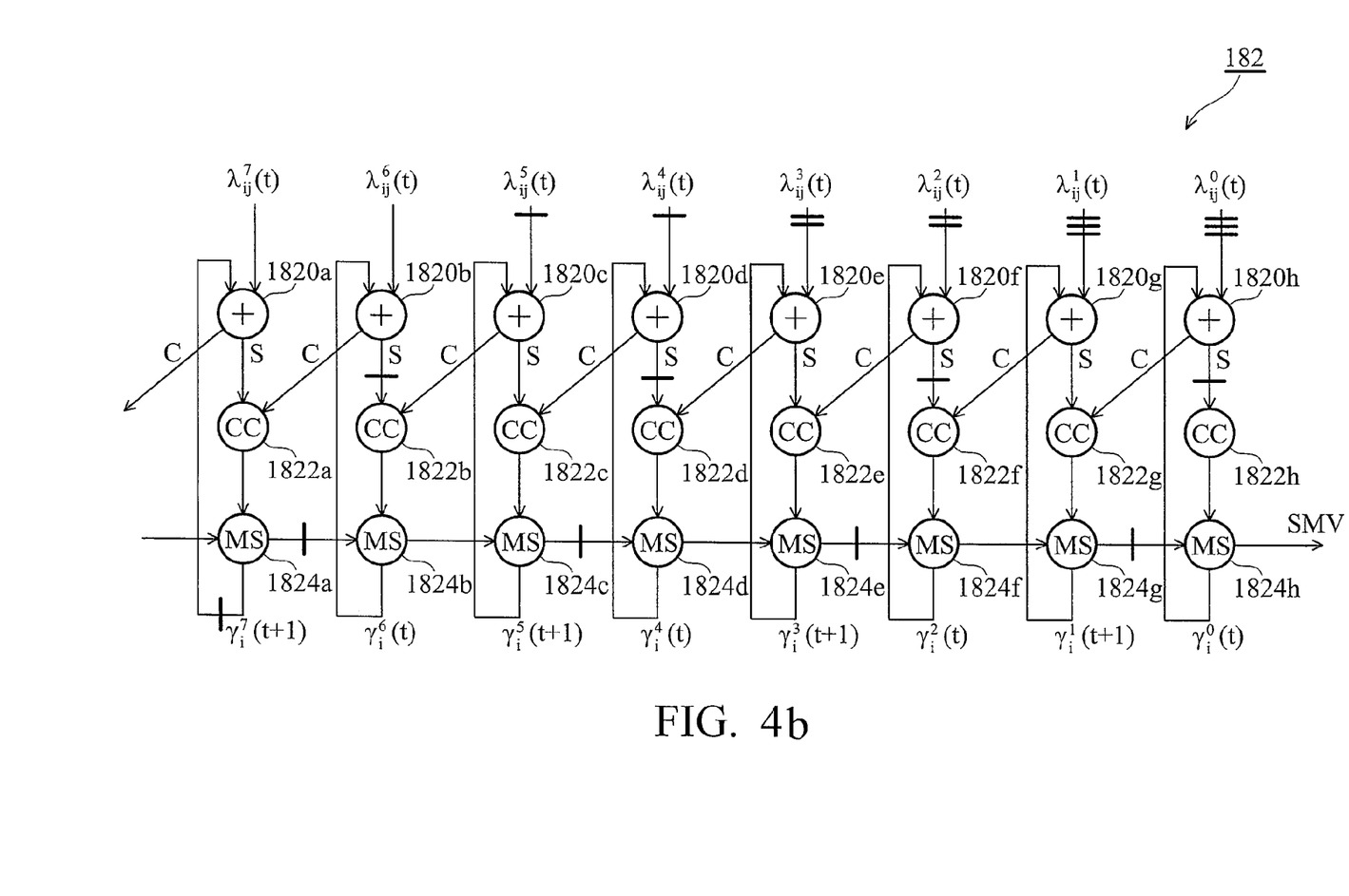
FIG. 4b is a circuit schematic of an exemplary ACS unit at bit-level, incorporated in the Viterbi decoder in FIG. 2

FIG. 4b is a circuit schematic of an exemplary ACS unit at bit-level, excluding most significant bit-pair (MSB), incorporated in the Viterbi decoder in FIG. 2, comprising adders 1820a through h, code converters (CC) 1822a through h, and maximum likelihood select units (MS) 1824a through h. ACS unit 182 in FIG. 4b receives 8-bit branch metrics $\lambda_{ij}^7(t)$ to $\lambda_{ij}^0(t)$, and utilizes a pipelined structure to process current path metrics $\gamma_j(t)$ in an order of seventh bit-pair $\gamma_j^7(t)$ to least significant bit-pair (LSB) $\gamma_j^0(t)$, thereby reducing the length of the critical paths and enhancing speed performance thereof. Upon completion of pipelined operation, MS 1824h for LSB $\gamma_j^0(t)$ produces the survivor path to survivor metric unit 184.

Figure 5A:
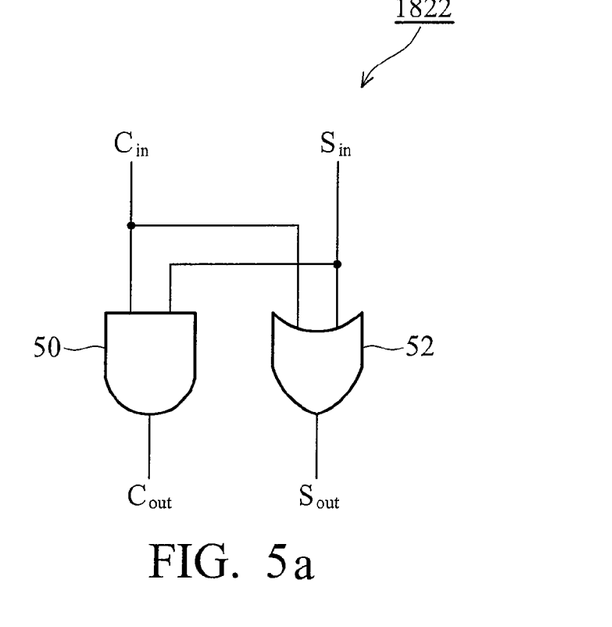
FIG. 5a is a circuit diagram of an exemplary code converter in FIGS. 4a and 4b.
Figure 5B:
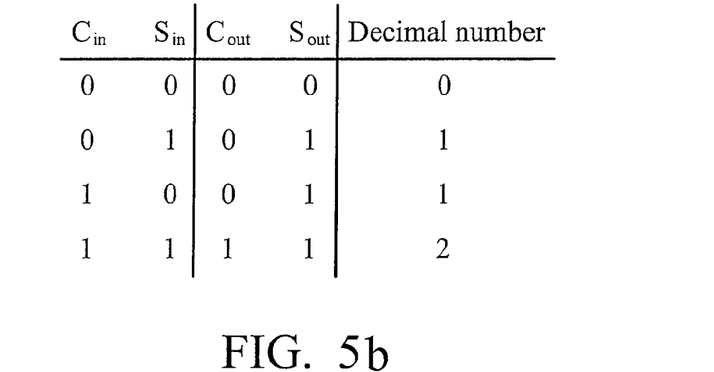

FIG. 5a is a circuit diagram of an exemplary code converter in FIGS. 4a and 4b, comprising AND gate 50 and OR gate 52 coupled thereto. FIG. 5b is a truth table of code converter 1822, incorporating the code converter in FIG. 5a. Code converter 1822 converts input sum $S_{in}$ and input carry $C_{in}$ to output sum $S_{out}$ and output carry $C_{out}$ according to the truth table in FIG. 5b, simplifying the circuit implementation of the maximum likelihood select unit 1824.

Referring now to FIGS. 4a and 4b, Viterbi decoder 18 may adopt a minimum selection algorithm so that maximum likelihood select unit 1824 comprises a minimum select circuit selecting a minimum within the recoded current path metrics to produce a survivor metric. In another embodiment, Viterbi decoder 18 utilizes a maximum selection algorithm, and maximum likelihood select unit 1824 comprises a maximum select circuit selecting a maximum within the recoded current path metrics to produce the survivor metric.

ACS unit 182 utilizes a minimum number of bit-pairs, referred to as a minimum width, to prevent the path metrics from overflowing before the path metrics comparison process in the maximum likelihood select unit 1824 occurs.

Figure 6:
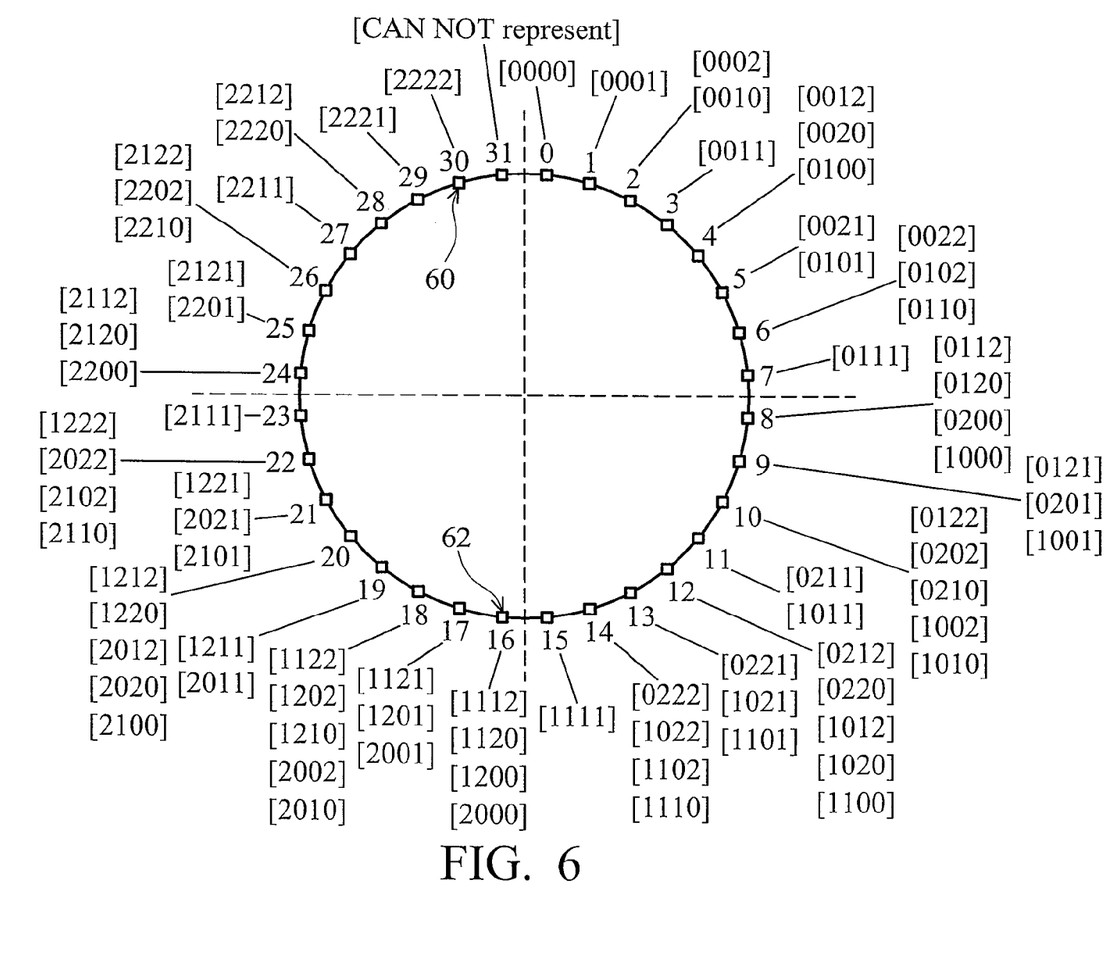

FIG. 6 is an abstract illustration of an exemplary ACS operation of the invention, incorporating the ACS unit 182 in FIG. 4a, comprising reference circle 6 and path metrics 60 and 62.

Circle 6 comprises 0 through 31 positions thereon represented by 4 bit-pair numbers in redundant number representation alongside. Path metrics 60 and 62 are 4 bit-pair numbers, each holding one of 31 possible values positioned on circle 6. The comparison and selection process may be viewed as a race between path metrics 60 and 62 around circle 6. A constraint of determining a leader in the race is that the maximum difference between the two runners 60 and 62 is less than half the circumference of circle 6. For example, when path metric 60 is at position 30 and path metric 62 is at position 16, path metric 60 is the leader provided the maximum difference therebetween is less than 15. The maximum difference between any two path metrics, referred to as a dynamic range, is determined by a number of possible states and decoding stages. For example, in a 5-bit soft input, 64-state Viterbi decoder, the dynamic range is 180, resulting in 8 bit-pairs (0-511) a minimal width for ACS unit 182.

While 4 bit-pair number is deployed in FIG. 6, it can be seen that other numbers of bit-pairs may be implemented as appropriate.

Figure 7:
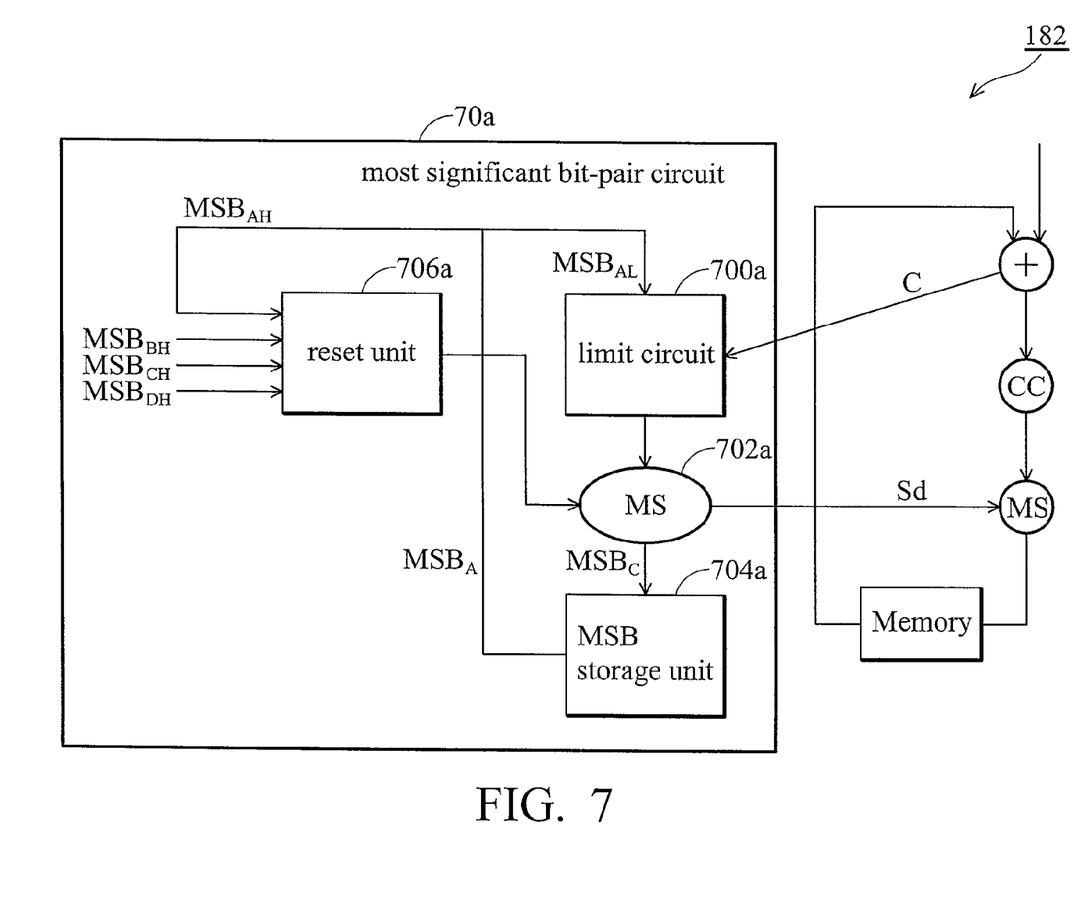

FIG. 7 is a block diagram of an exemplary most significant bit-pair (MSB) in ACS unit 182a of FIG. 4a to realize the ACS operation in FIG. 6, comprising limiting circuit 700a, MSB maximum select unit 702a, MSB storage unit 704a, and reset unit 706a. Limiting circuit 700a is coupled to MSB maximum select unit 702a, MSB storage unit 704a, and subsequently to reset unit 706a.

In one embodiment, Viterbi decoder 18 is a 4-state decoder, where each convolutional data Dc may be in one of states A, B, C, and D corresponding to ACS units 182a, b, c, and d. Each ACS unit 182 employs bit-pipelined and redundant number represented structure, in conjunction with most significant bit-pair circuit 70a to generate first path metric $PM_1$ and first survivor metric $SM_1$, providing minimal width to reduce circuit dimensions and manufacturing cost, while keeping performance and the critical path in ACS unit 182 unchanged. Each bit-pair in the redundant number representation comprises a high bit and a low bit, for example, a most significant bit-pair MSB comprises MSB high bit $MSB_H$ and MSB low bit $MSB_L$.

Limiting circuit 700a receives and accumulates carry bit C from previous bit pair to generate current most significant bit-pair $MSB_c$ until reaching first predetermined value $lim_1$, and limits current most significant bit-pair $MSB_c$ to value $lim_1$. In one embodiment, first predetermined value $lim_1$ is bit-pair "11", limiting circuit 700a limits the current most significant bit-pair $MSB_c$ at maximum bit-pair "11", preventing overflow of first path metric PM1.

MSB maximum select (MS) unit 702a compares current most significant bit-pairs $MSB_c$ from limiting circuit 700a and ACS units 182b, c, d to determine MSB decision signals based on maximum likelihood selection, thereby producing first survivor metric $SM_1$ at the least significant bit-pair of ACS unit 182a. MSB maximum select (MS) unit 702a compares all four current most significant bit-pairs $MSB_c$ and selects the MSB decision signals corresponding to one with maximum likelihood. MSB decision signals may comprise preliminary decision bit $d_{PM}$ and final decision bit $d_{FM}$, as disclosed in "A 550 Mb/s radix-4 bit-level pipelined 16-state 0.25-µm CMOS Viterbi decoder", International Conference on Application Specific Systems, Architecture, and Processors on Jul. 10-12, 2000 by V/S Gierenz, O. Weiβ, T. G. Noll, I. Carew, J. Ashley, and R. Karabed, an implementation of MSB maximum select unit 702a may be also base thereon. Maximum likelihood selection may select maximum or minimum of current most significant bit-pairs $MSB_c$ from limiting circuit 700a and another ACS unit 182b.

MSB storage unit 704a receives current most significant bit-pair $MSB_c$ of first path metrics $PM_1$ from MSB maximum select unit 702a to store therein. MSB storage unit 704a may be a register capable of holding a bit-pair and outputting previous most significant bit-pair $MSB_A$.

Reset unit 706a compares bit-pairs $MSB_{AH}$, $MSB_{BH}$, $MSB_{CH}$, $MSB_{DH}$ from ACS units 182a, b, c, and d with first predetermined value $lim_1$. Upon previous bit-pairs $MSB_{AH}$, $MSB_{BH}$, $MSB_{CH}$ and $MSB_{DH}$ reaching first predetermined value $lim_1$, reset unit 706a resets current most significant bit-pair $MSB_C$ to second predetermined value $lim_2$. Second predetermined value $lim_2$ may be bit-pair "00", i.e., when previous most significant bit-pairs $MSB_{AH}$ through $MSB_{DH}$ reach "11", reset units 706 a through d reset corresponding current bit-pairs $MSB_C$ to "00". Referring to FIG. 6, reset unit 706a shifts first path metric PM1 from left-half circle represented by [2xxx] to right-half circle represented by [0xxx] when all four most significant bit-pairs $MSB_A$ reach to the left-half circle, with the lower 3 bit-pairs remaining unchanged, simplifying the comparison process in MSB maximum select unit 702a since no cross-boundary comparison ([2xxx] compares with [0xxx]) is required.

Figure 8:
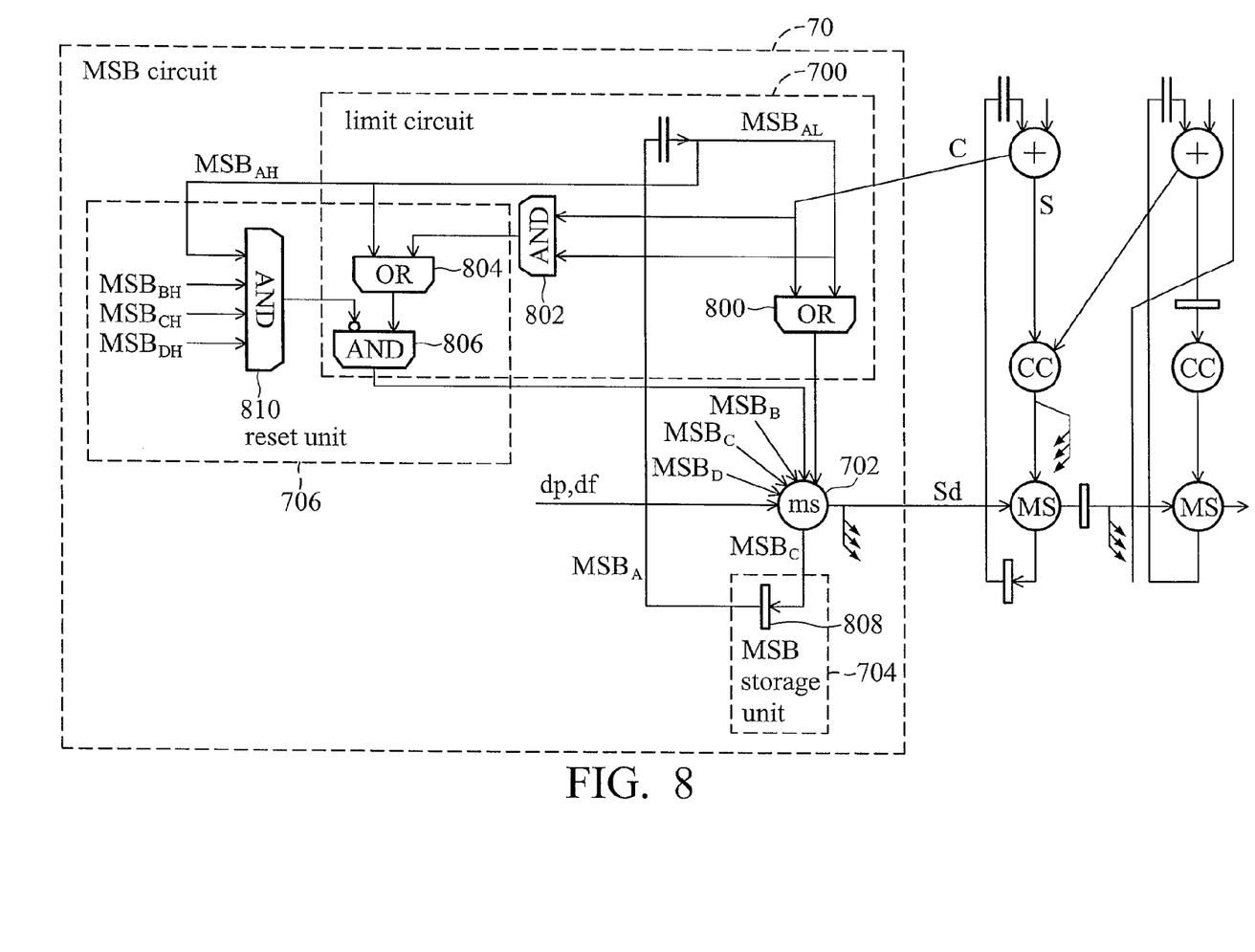
FIG. 8 is a schematic diagram of an exemplary most significant bit-pair (MSB) in FIG. 7.

FIG. 8 is a schematic diagram of an exemplary most significant bit-pair (MSB) in FIG. 7, where limiting circuit 700 comprises first OR gate 800, first AND gate 802, second OR gate 804, and second AND gate 806, MSB storage unit 704 comprises register 808, and reset unit 706 comprises third AND gate 810, second OR gate 804, and second AND gate 806. First OR gate 800 is coupled to first AND gate 802, second OR gate 804, and then to second AND gate 806. Second third AND gate 810 and second OR gate 804 are coupled to second AND gate 806.

Limiting circuit 700 combines carry bit c from previous bit-pair 72 with previous most significant bit-pair $MSB_A$ to generate current most significant bit-pair $MSB_c$, and limits current most significant bit-pair $MSB_c$ to first predetermined value $lim_1$. First OR gate 800 performs OR on carry bit c from previous bit-pair 82 and low bit $MSB_{AL}$ of previous most significant bit-pair $MSB_A$ to generate and limit low bit $MSB_{CL}$ of current most significant bit-pair $MSB_C$ to b'1'. First AND gate 802 performs an AND operation on carry bit c and low bit $MSB_{AL}$ to produce a fist AND output to second OR gate 804, where the first AND output in conjunction with high bit $MSB_{AH}$ of previous most significant bit-pair $MSB_A$ are ORed to output a second OR output to second AND gate 806, thereby producing and limiting high bit $MSB_{CH}$ of current most significant bit-pair $MSB_c$ to b'1'.

Reset unit 706 receives four high bits $MSB_{AH}$ from ACS units 182a through d, and resets high bit $MSB_{CH}$ of current most significant bit-pair $MSB_c$ to b'0' when all high bits $MSB_{AH}$ reach a high bit of second predetermined value $lim_2$. In the case where second predetermined value $lim_2$ is '11', Reset unit 706 resets high bit $MSB_{CH}$ to b'0' when all high bits $MSB_{AH}$ reach b'1'. Third AND gate 810 receives four high bits $MSB_{AH}$ from ACS units 182a through d, performs an AND operations on all four high bits $MSB_{AH}$ to generate a third AND output, an inverted third AND output in conjunction with the second OR output of second OR gate 804, are ANDed together in second AND gate 806 to reset high bit $MSB_{CH}$ of current most significant bit-pair $MSB_C$ to b'0'.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An add-compare-select (ACS) unit, generating first path metrics having a first bit-pair and a most significant bit-pair (MSB), wherein each bit-pair is in redundant number representation having a high bit and a low bit, the ACS unit comprising:
    a first ACS circuit producing the first bit-pair of the first path metrics and a first carry;
    a limiting circuit coupled to the first ACS circuit, generating the MSB of the first path metrics based on the first carry, and limiting the MSB of the first path metrics to a first predetermined value;
    an MSB maximum select (MS) unit coupled to the limiting circuit and another ACS unit, receiving an MSB of second path metrics from the other ACS unit, and comparing the MSBs of the first and the second path metrics to determine MSB decision signals based on maximum likelihood selection;
    an MSB storage unit coupled to the MSB maximum select unit, storing the MSB of the first path metrics as an MSB of a previous first path metric; and
    a reset unit coupled to the MSB maximum select unit and the MSB storage unit, resetting the MSB of the first path metrics to a second predetermined value when the high bits of the MSBs of the first and the second path metrics reach the first predetermined value.

2. The ACS unit of claim 1, wherein the limiting circuit comprises:
    a first OR gate coupled to the first ACS circuit and the MSB storage unit, ORing the first carry and the low bit of the MSB of the previous first path metrics to generate the low bit of the MSB of the first path metric;
    a first AND gate coupled to the first ACS circuit and the MSB storage unit, ANDing the first carry and the low bit of the MSB of the previous first path metrics to produce a first AND output;
    a second OR gate coupled to the first AND gate and the MSB storage unit, ORing the first AND output and the high bit of the MSB of the previous first path metrics to provide second OR output; and
    a second AND gate coupled to the second OR gate and the other ACS unit, receiving the second OR output to produce and limit the high bit of the MSB of the first path metrics.

3. The ACS unit of claim 1, wherein the reset unit comprises:
    a second AND gate coupled to the other ACS unit and the MSB storage unit, ANDing the high bits of the MSB of the previous first and second path metrics to generate a second AND output;
    a second OR gate coupled to the first AND gate and the MSB storage unit, receiving the MSB of the previous first path metrics to provide a second OR output; and
    a third AND gate coupled to the second AND gate and the second OR gate, ANDing the second AND output and the second OR output to reset the high bit of the MSB of the first path metrics.

4. The ACS unit of claim 1, wherein the first predetermined value is binary 1, and the second predetermined value is binary 0.

5. The ACS unit of claim 1, wherein the MSB decision signals comprise a decision preliminary signal and a decision final signal.

6. The ACS unit of claim 1, wherein the first ACS circuit is pipelined and comprises:
    a first carry save adder (CSA) having two first CSA inputs and a first CSA carry output, and a first CSA sum output, receiving a first bit of first branch metrics at one first CSA input thereof, and outputting the first carry at the first CSA carry output;
    a first code converter (CC) having a first CC sum input, a first CC carry input, and a first CC output, the first CC sum input coupled to the first CSA sum output;
    a first maximum select unit having a first maximum select unit input, a first maximum select output, a first decision input and first decision output, the first maximum select unit input coupled to the first CC output, receiving the MSB decision signals at the first decision input, and outputting first decision signals at the first decision output;

a first storage unit having a first storage input and first storage output, the first storage input coupled to the first maximum select output, and the first storage output coupled to the other first CSA input;

a second storage unit having a second storage input and a second storage output, receiving the first decision signals at the second storage input and outputting the first decision signals at the second storage output;

a second CSA having two second CSA inputs, a second CSA carry output, and a second CSA sum output, receiving a second bit of the first branch metrics at one second CSA input thereof, and the second CSA carry output coupled to the first CC carry input;

a third storage having a third storage input and third storage output, the third storage input coupled to the second CSA sum output;

a second CC having a second CC sum input, a second CC carry input, and a second CC output, the second CC sum input coupled to the second storage output; and a second maximum select unit having a second maximum select unit input, a second maximum select output, a second decision input, and a second decision output, the second maximum select unit input coupled to the second CC output, the second maximum select output coupled to the other second CSA input, receiving the MSB decision signals at the second decision input, and outputting second decision signals at the second decision output.

7. The ACS unit of claim 1, wherein the ACS unit is deposited in a maximum likelihood decoder using Radix-4 algorithm, the ACS unit further receives third and fourth path metrics, and the MSB maximum select unit further compares the MSBs of all four path metrics and selects therefrom the MSB decision signals with maximum likelihood selection.

8. The ACS unit of claim 7, wherein the maximum likelihood decoder is a Viterbi decoder.

9. A maximum likelihood decoder, comprising:
a branch metrics unit calculating branch metrics from input data;
an add-compare-select (ACS) unit coupled to the branch metrics unit, receiving the branch metrics and second path metrics from a second ACS unit to generate first path metrics having a first bit-pair and a most significant bit-pair (MSB), and survivor metrics, wherein each bit-pair is in redundant representation having a high bit and a low bit, comprising;
a first ACS circuit producing the first bit-pair of the first path metrics, a first carry, and the survivor metrics; and
an MSB ACS circuit, comprising:
a limiting circuit coupled to the first ACS circuit, generating the MSB of the first path metrics based on the first carry, and limiting the MSB of the first path metrics to a first predetermined value;
an MSB maximum selection (MS) unit coupled to the limiting circuit, receiving an MSB of second path metrics from the other ACS unit, and comparing the MSBs of the first and the second path metrics to determine MSB decision signals based on maximum likelihood selection;
an MSB storage unit coupled to the MSB maximum select unit, storing the MSB of the first path metrics as an MSB of a previous first path metric; and
a reset unit coupled to the MSB maximum select unit and the MSB storage unit, resetting the MSB of the first path metrics to a second predetermined value when the high bits of the MSBs of the first and the second path metrics reach the first predetermined value; and
a survivor metrics unit coupled to the ACS unit, tracing back the survivor path to decode the input data.

10. The maximum likelihood decoder of claim 9, wherein the limiting circuit comprises:
a first OR gate coupled to the first ACS circuit and the MSB storage unit, ORing the first carry and the low bit of the MSB of the previous first path metrics to generate the low bit of the MSB of the first path metric;
a first AND gate coupled to the first ACS circuit and the MSB storage unit, ANDing the first carry and the low bit of the MSB of the previous first path metrics to produce a first AND output;
a second OR gate coupled to the first AND gate and the MSB storage unit, ORing the first AND output and the high bit of the MSB of the previous first path metrics to provide second OR output; and
a second AND gate coupled to the second OR gate and the other ACS unit, receiving the second OR output to produce and limit the high bit of the MSB of the first path metrics.

11. The maximum likelihood decoder of claim 9, wherein the reset unit comprises:
a second AND gate coupled to the other ACS unit and the MSB storage unit, ANDing the high bits of the MSB of the previous first and second path metrics to generate a second AND output;
a second OR gate coupled to the first AND gate and the MSB storage unit, receiving the MSB of the previous first path metrics to provide a second OR output; and
a third AND gate coupled to the second AND gate and the second OR gate, ANDing the second AND output and the second OR output to reset the high bit of the MSB of the first path metrics.

12. The maximum likelihood decoder of claim 9, wherein the first predetermined value is binary 1, and the second predetermined value is binary 0.

13. The maximum likelihood decoder of claim 9, wherein the maximum likelihood decoder uses Radix-4 algorithm, the ACS unit further receives third and fourth path metrics, and the MSB maximum select unit further compares the MSBs of all four path metrics and selects therefrom the MSB decision signals with maximum likelihood selection.

14. The maximum likelihood decoder of claim 9, wherein the MSB decision signals comprise a decision preliminary signal and a decision final signal.

15. The maximum likelihood decoder of claim 9, wherein the first ACS circuit is pipelined and comprises:
a first carry save adder (CSA) having two first CSA inputs and a first CSA carry output, and a first CSA sum output, receiving a first bit of first branch metrics at one first CSA input thereof, and outputting the first carry at the first CSA carry output;
a first code converter (CC) having a first CC sum input, a first CC carry input, and a first CC output, the first CC sum input coupled to the first CSA sum output;
a first maximum select unit having a first maximum select unit input, a first maximum select output, a first decision input and first decision output, the first maximum select unit input coupled to the first CC output, receiving the MSB decision signals at the first decision input, and outputting first decision signals at the first decision output;

a first storage unit having a first storage input and first storage output, the first storage input coupled to the first maximum select output, and the first storage output coupled to the other first CSA input;

a second storage unit having a second storage input and a second storage output, receiving the first decision signals at the second storage input and outputting the first decision signals at the second storage output;

a second CSA having two second CSA inputs, a second CSA carry output, and a second CSA sum output, receiving a second bit of the first branch metrics at one second CSA input thereof, and the second CSA carry output coupled to the first CC carry input;

a third storage having a third storage input and third storage output, the third storage input coupled to the second CSA sum output;

a second CC having a second CC sum input, a second CC carry input, and a second CC output, the second CC sum input coupled to the second storage output; and a second maximum select unit having a second maximum select unit input, a second maximum select output, a second decision input, and a second decision output, the second maximum select unit input coupled to the second CC output, the second maximum select output coupled to the other second CSA input, receiving the MSB decision signals at the second decision input, and outputting second decision signals at the second decision output.

16. The maximum likelihood decoder of claim 9, wherein the maximum likelihood decoder is a Viterbi decoder.

17. An add-compare-select (ACS) method for generating first path metrics having a first bit-pair and a most significant bit-pair (MSB) by an ACS unit, where each bit-pair is in redundant number representation having a high bit and a low bit, comprising:

producing the first bit-pair of the first path metrics and a first carry by a first ACS circuit of the ACS unit;

generating the MSB of the first path metrics based on the first carry by a limiting circuit of the ACS unit, limiting the MSB of the first path metrics to a first predetermined value by the limiting circuit of the ACS unit;

comparing the MSBs of the first path metrics and second path metrics from another ACS unit to determine MSB decision signals based on maximum likelihood selection by an MSB maximum select (MS) unit of the ACS unit;

storing the MSB of the first path metrics as an MSB of a previous first path metric in an MSB storage unit of the ACS unit; and resetting the MSB of the first path metrics to a second predetermined value by a reset unit of the ACS unit when the high bits of the MSBs of the first and the second path metrics reach the first predetermined value.

18. The ACS method of claim 17, wherein the first predetermined value is binary 1, and the second predetermined value is binary 0.

19. The ACS method of claim 17, further receives third and fourth path metrics, and the comparing step further comprises comparing the MSBs of all four path metrics and selects therefrom the MSB decision signals with maximum likelihood selection.

20. The ACS method of claim 17, wherein the MSB decision signals comprise a decision preliminary signal and a decision final signal.

* * * * *